(12) United States Patent
Cortez Hernandez et al.

(10) Patent No.: US 12,101,895 B2
(45) Date of Patent: Sep. 24, 2024

(54) MOTORIZED MECHANISM FOR CONTROL PANEL

(71) Applicant: CONTROLADORA MABE S.A. DE C.V., Mexico City (MX)

(72) Inventors: David Ricardo Cortez Hernandez, Queretaro (MX); Cristopher Lopez Regalado, Queretaro (MX); Luis Enrique Salas Rico, Queretaro (MX)

(73) Assignee: CONTROLADORA MABE S.A. DE C.V., Mexico City (MX)

( * ) Notice: Subject to any disclaimer, the term of this patent is extended or adjusted under 35 U.S.C. 154(b) by 378 days.

(21) Appl. No.: 17/450,600

(22) Filed: Oct. 12, 2021

(65) Prior Publication Data

US 2022/0117095 A1    Apr. 14, 2022

(30) Foreign Application Priority Data

Oct. 13, 2020    (MX) .................. MX/A/2020/010827

(51) Int. Cl.
*H05K 5/00*    (2006.01)
*F16M 11/10*    (2006.01)
*F16M 13/02*    (2006.01)

(52) U.S. Cl.
CPC ........... *H05K 5/0017* (2013.01); *F16M 11/10* (2013.01); *F16M 13/02* (2013.01)

(58) Field of Classification Search
CPC ...... F16M 11/00; F16M 13/02; H05K 5/0204; H05K 5/0226; A47B 46/00
See application file for complete search history.

(56) References Cited

U.S. PATENT DOCUMENTS

| | | | |
|---|---|---|---|
| 7,031,144 B2* | 4/2006 | Carter .................... | B01L 1/025 |
| | | | 361/679.29 |
| 9,863,642 B2* | 1/2018 | Je ............................ | F24C 7/082 |
| 2009/0206070 A1* | 8/2009 | Ortner .................... | F24C 3/124 |
| | | | 116/307 |
| 2018/0187897 A1* | 7/2018 | Kim ....................... | F24C 7/086 |
| 2022/0154938 A1* | 5/2022 | Bucks .................... | F24C 3/124 |

FOREIGN PATENT DOCUMENTS

| | | |
|---|---|---|
| CN | 204332260 U | 5/2015 |
| CN | 204592741 U | 8/2015 |
| CN | 105938683 A | 9/2016 |
| CN | 110477609 A | 11/2019 |
| CN | 209661267 U | 11/2019 |

* cited by examiner

*Primary Examiner* — Daniel J Rohrhoff
(74) *Attorney, Agent, or Firm* — Heslin Rothenberg Farley & Mesiti, PC (57) ABSTRACT

Present invention refers to a motorized mechanism, for control panel which allows said control panel to move from a working position to a resting position, such that a fixed frame is found static and coupled to a household appliance such as a stove or an oven, while a mobile frame partially protrudes from said fixed frame to allow for a better view of said control panel.

20 Claims, 7 Drawing Sheets

MOTORIZED MECHANISM FOR CONTROL PANEL

CROSS REFERENCE TO RELATED APPLICATIONS

This application claims priority under 35 U.S.C. § 119 to Mexican Patent Application No. MX/a/2020/010827 filed on Oct. 13, 2020, in the Mexican Intellectual Property Office, which is incorporated herein by reference in its entirety.

OBJECT OF THE INVENTION

Instant invention refers to a motorized mechanism for a control panel, preferably set in a household appliance, although it can be set in any other device; said mechanism allows for tilting of said control panel, in such a way that after driving said mechanism, the control panel moves from a resting position to a working position, in such a way that it partially protrudes from the device on which it is installed, to later return to its resting position.

BACKGROUND

Within the state of the art, the following documents are found:

Utility Model CN 204592741 U refers to a rotary touch LCD visual device and an implementation method thereof, so that the problem of switch position is avoided and the viewing angle can accomplish seeing the LCD screen display, and at the same time, decreases noises and eliminates conference desktop problems, and the stable structure may prolong the service life of the device;

Patent application CN 105938683 A refers to a smart rotating display screen comprising an installation seat, a display screen, and a rotation mechanism; the rotation mechanism comprises a circuit control unit, a drive assembly and a positioning assembly; the drive assembly includes a reciprocating mechanism, a push piece and at least one linkage, a reciprocating mechanism when pushing the connecting linkage, the linkage and installation are a sliding linkage, the linkage and the edge parts of the screen are framed with a drive side; the positioning assembly comprises a mechanical push rod and positioning for the positioning of the display screen, promotes the edges of two adjacent edges with hinged edges, hinged mechanical push rod, a mechanical push rod corresponding to the display screen and the other end of the installation seat is hinged; and the alternative driving parts are coupled to the circuit control unit. The display screen is convenient so the users can remain stable and convenient to view the display screen, the input control is more convenient and smarter, it does not have blind spots and effectively guarantees that the viewer can normally see the display screen.

Application CN110477609 A refers to a rotating display device and a tea table, the rotating display device comprises a rotating mechanism, and a display screen turning mechanism comprises a support piece, a screen plate, a conducting module and at least one drive arm; the display plate is rotably arranged on the support piece and can rotate around the direction of the Y axis, and one end of the transmission module of the drive arm of the drive end is connected in a rotable manner, and can have a connection side along the length of the direction of the X axis, the display plate under the conduction of the conduction module is connected, and below the conduction module, to drive the screen plate to rotate around the Y axis direction in relation to the support, the screen is fixed on the screen plate. Said screen plate, which can support as a fulcrum, in order to undertake the turning, the turning action of the screen only needs one driving module and can be performed in combination with the drive arm, the structure is simple and easy to undertake a compact design structure, but also decreases the space occupancy rate by assembling the rotable display device;

Utility model CN209661267 U refers to a control panel with a turning mechanism and an electric vaporizer, related to the technical field of kitchen appliances. The turning mechanism of the control panel comprises a control panel, a support device and a driving device, the support device comprises a support seat and is provided in a mobile manner with the front and back direction of the groove in a strip-like shape connected with the groove of the fastening strip; the support device and the control panel are connected by a connecting rod mechanism, and the end of the driving mechanism of the connecting rod is articulated with the fastening piece; the fastening piece is connected to a water tank, a deflector of the control panel on the front side of the water tank, the driving end of the driving device connected to the fastener; the vaporizer comprises a turning mechanism in the body of the box and the control panel; the body of the box is provided with a support plate, a support seat of the turning mechanism in the control panel is connected to the support plate; on the turning mechanism of the control panel of the driving device may drive the control panel and the water tank to undertake different movements, the control panel towards the front opened in order to form the opening, the outer part of the water tank extends outwardly from the body of the box through the opening, the water tank of the user is found outside the body of the box adding a convenient operation;

Utility model CN 204332260 U refers to a bielaa double DIN stepped screen turning mechanism, applied to the intelligent vehicle charging terminal in the double DIN turning mechanism comprising: a multimedia touch control component for displaying the image, receiving the sound signal and receiving a touch signal; a box assembly for containing the hard disk and the circuit components, a rotating mechanism component, the multimedia touch component connected to the box assembly by means of the rotating mechanism assembly, a rotating mechanism component is placed between said multimedia touch control assembly and chassis assembly, the multimedia touch assembly having been placed in the established position regarding the chassis component, by means of the multimedia touch assembly which can be a recorder, GPS navigation, video monitor, multimedia playback, etc. which enriches the double DIN staggered screen with turning mechanism function, the turning mechanism assembly can make the multimedia hard disk conveniently disassembled from the touch component is rotated to place the convenient hard disk disassembly structure.

BRIEF DESCRIPTION OF THE INVENTION

Present invention refers to a motorized mechanism for the control panel comprising a fixed frame which presents a first pivot set above an upper end of said fixed frame and further away from a front face of said fixed frame; a mobile frame set on the inner part of the fixed frame, said mobile frame presents a second pivot set above an upper end of said mobile frame and further away from a front face of said mobile frame; said first and second pivots are attachable to each other; a drive motor set on a first side wall of the fixed frame, said drive motor is found in rotary coupling with a crankshaft, said crankshaft has support between the first side wall and the second side wall, the second side wall being diametrically opposed to the first side wall; at least one drive arm presenting a first end coupled to said crankshaft and a second end coupled to a side wall of the mobile frame, in such a way that upon driving the drive motor, it causes the crankshaft to turn, after half a turn of the crankshaft, said at least one drive arm pushes the mobile frame to a working position outside the fixed frame, the crankshaft upon making a complete turn, the drive arm pulls said mobile frame to a resting position aligned with the fixed frame.

The description provides illustrative examples of several aspects and embodiments of instant invention, and seeks to provide a general frame or panorama for the understanding of the nature and character of the claimed aspects and embodiments. The accompanying figures are included to provide illustrations and additional understanding of the different aspects and embodiments, and are included and constitute part of this specification. The figures, along with the specification, help to explain the described and claimed aspects and embodiments.

BRIEF DESCRIPTION OF THE FIGURES

The illustrative embodiment can be described referencing the accompanying figures, which refer to.

DETAILED DESCRIPTION OF THE INVENTION

The following detailed description is merely an example and does not seek to limit the described embodiments or the application and the use of the described embodiments. In the manner in which the words "example" or "illustrative" are used throughout the specification, they mean "they serve as an example, an instance or illustration" and should not be interpreted as meaning the preferred or advantageous over the other implementations. All below described implementations are examples of implementations provided to allow persons skilled in the art to undertake or use the embodiments provided in the specification and does not seek to limit the scope of the disclosure. For the purposes of instant description, the terms "upper", "lower", "left", "right", "back", "front", "vertical", "horizontal" and their derivatives refer to the invention as it is oriented in the figures. Furthermore, no intention exists of being subject to any explicit or implicit theory presented in prior technical field, background, brief summary or the detailed description. It should also be understood that the specific devices and processes illustrated in the attached drawings and described in the following specification, are simply examples of embodiments of the inventive concepts defined in the attached claims. Thus, the specific shapes and other physical features related to the embodiments described in instant document must not be considered as limiting, unless the claims expressly indicate the opposite.

Figure 1:
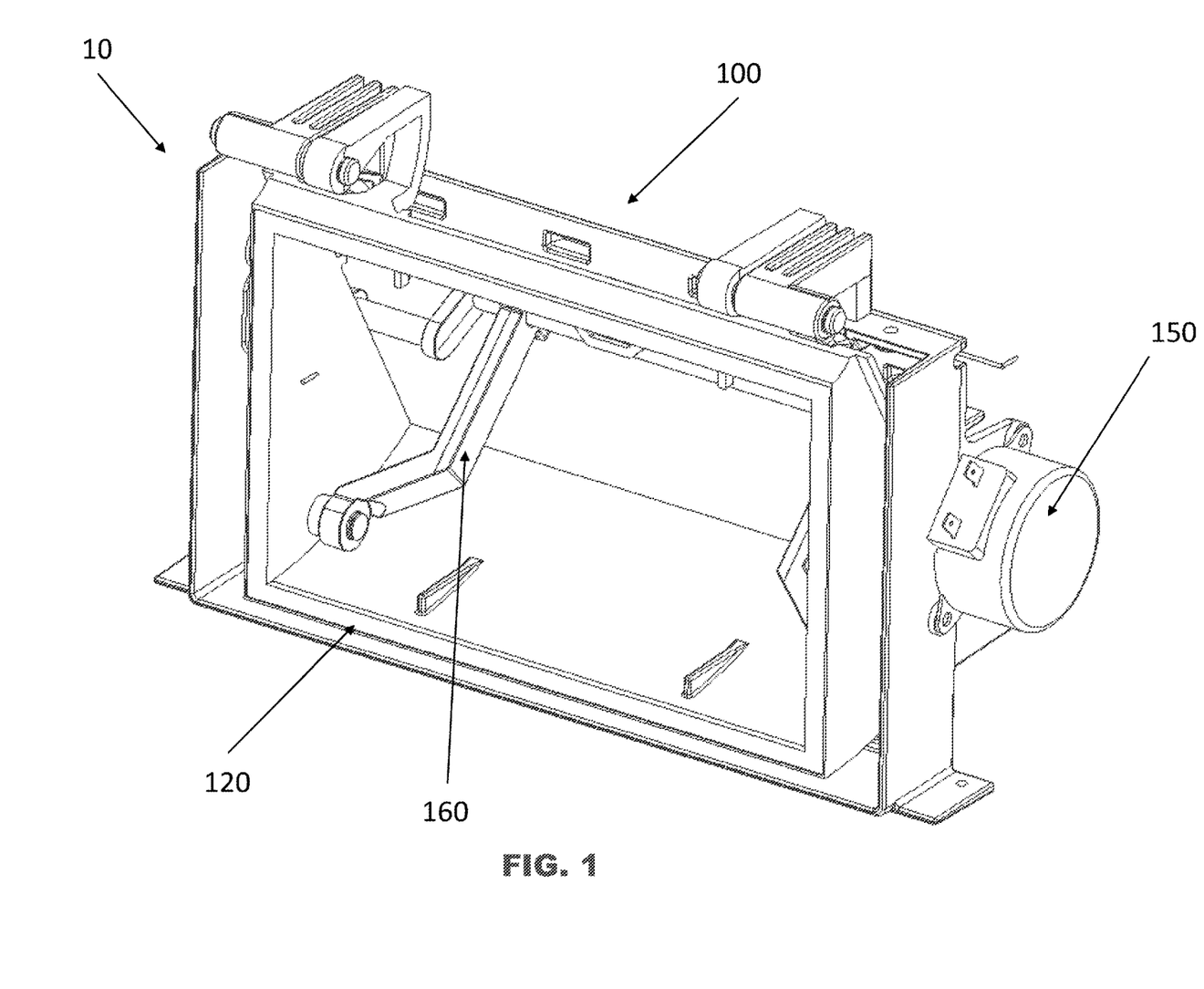
FIG. 1 refers to a right front perspective view of the motorized mechanism of instant invention in a resting position.
Figure 2:
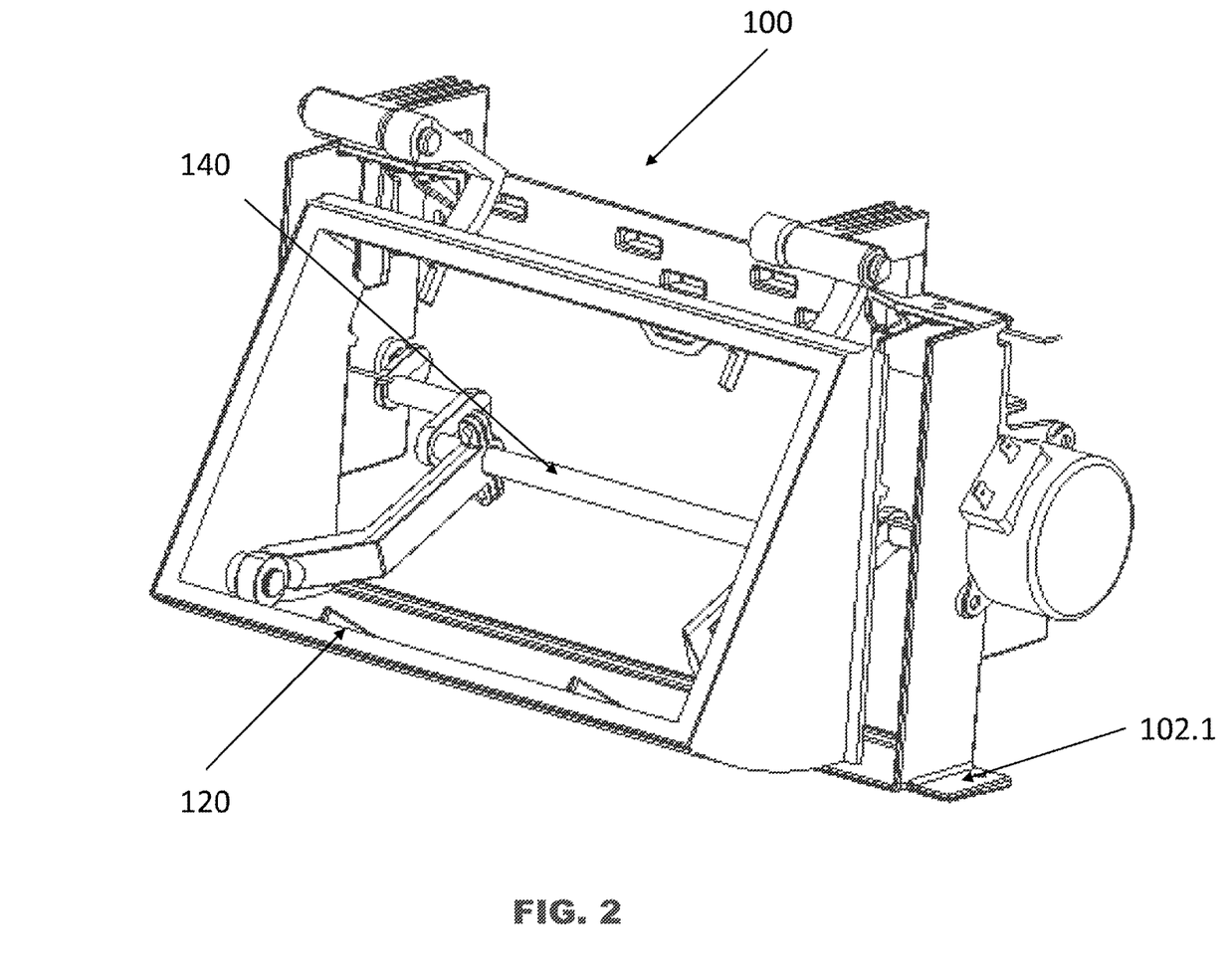
FIG. 2 is a right front perspective view of the motorized mechanism of instant invention in a working position.
Figure 3:
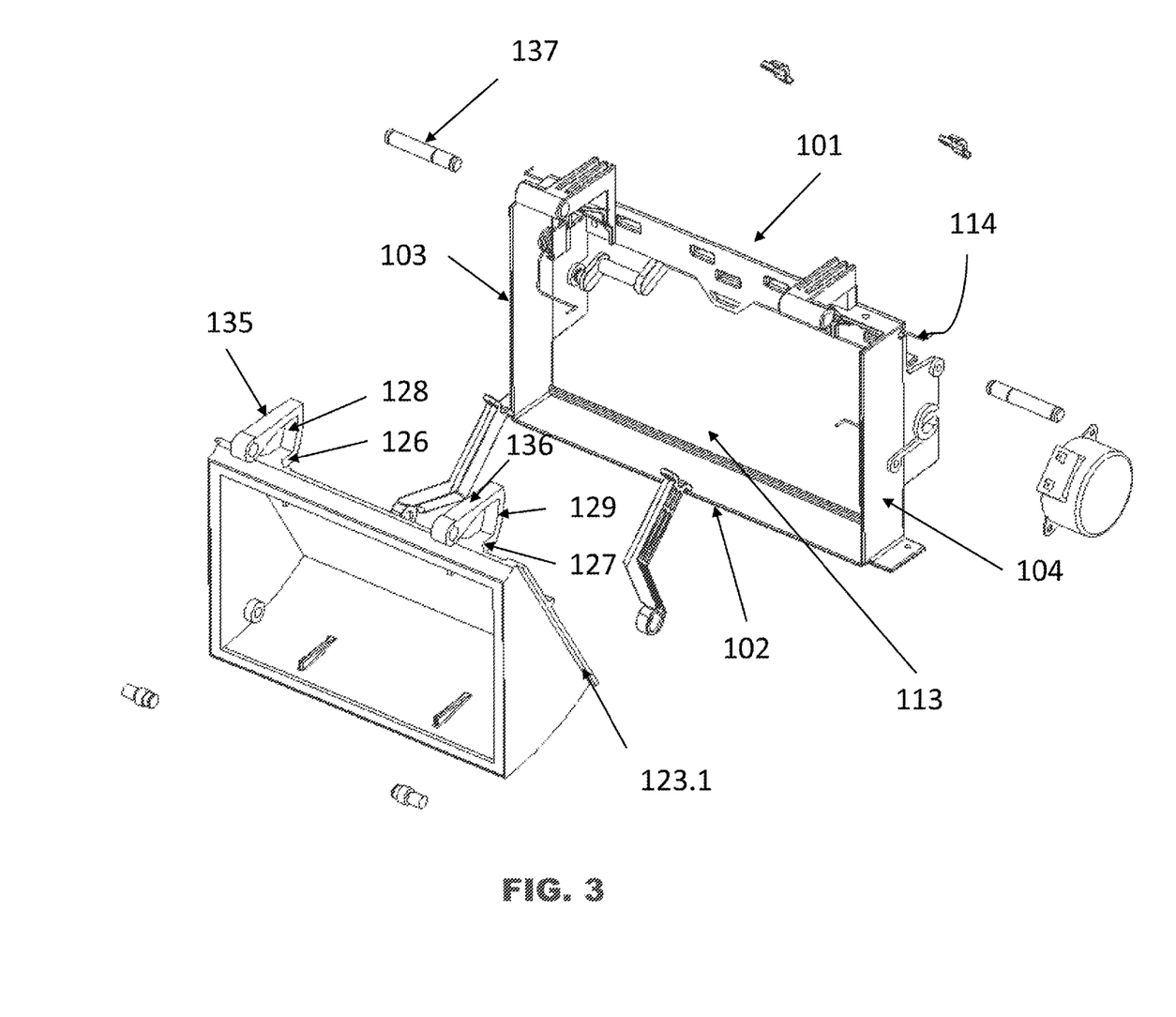
FIG. 3 is an exploded front perspective view of the motorized mechanism of instant invention.
Figure 4:
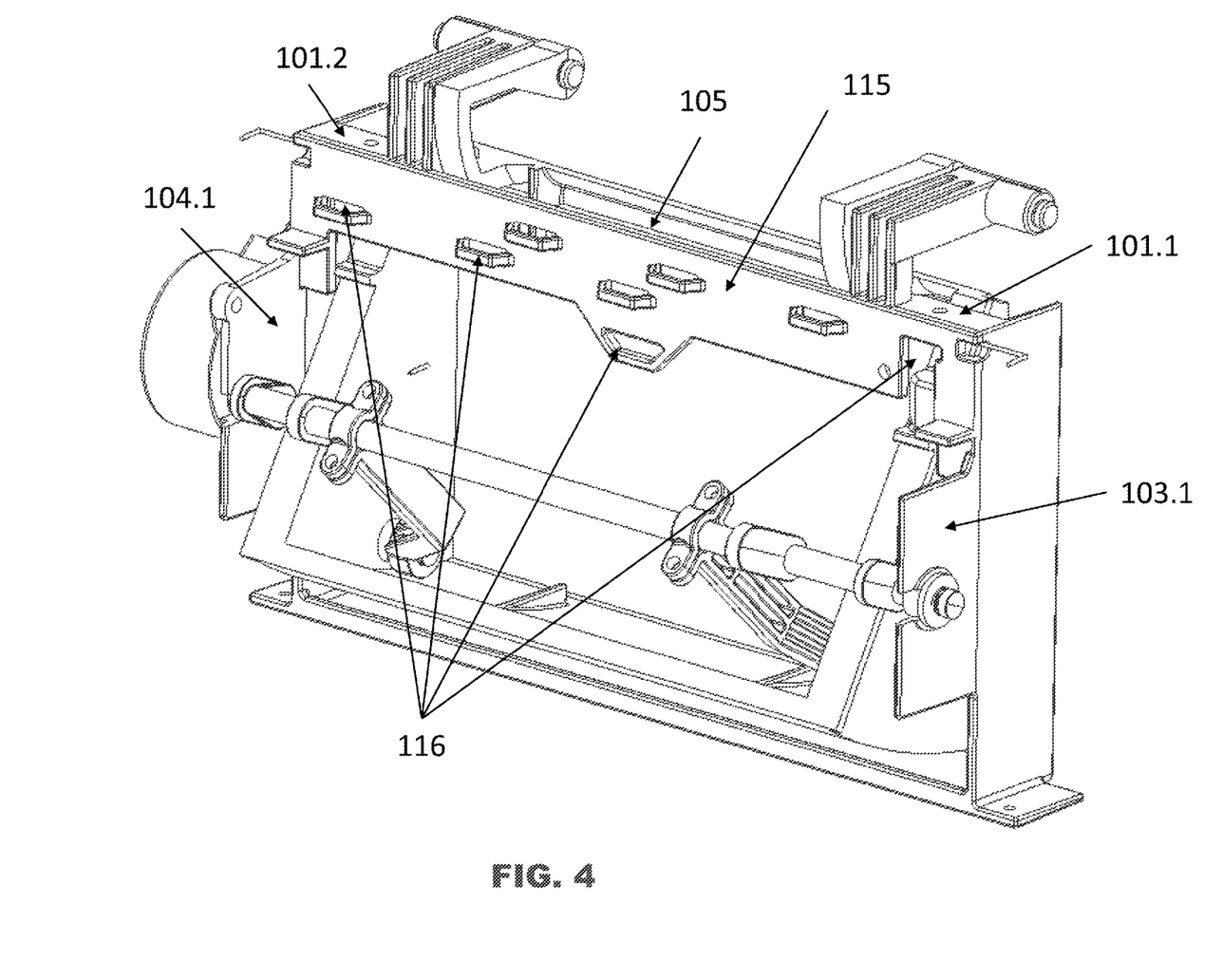
FIG. 4 refers to a back left perspective view of the motorized mechanism of instant invention in a resting position.
Figure 5:
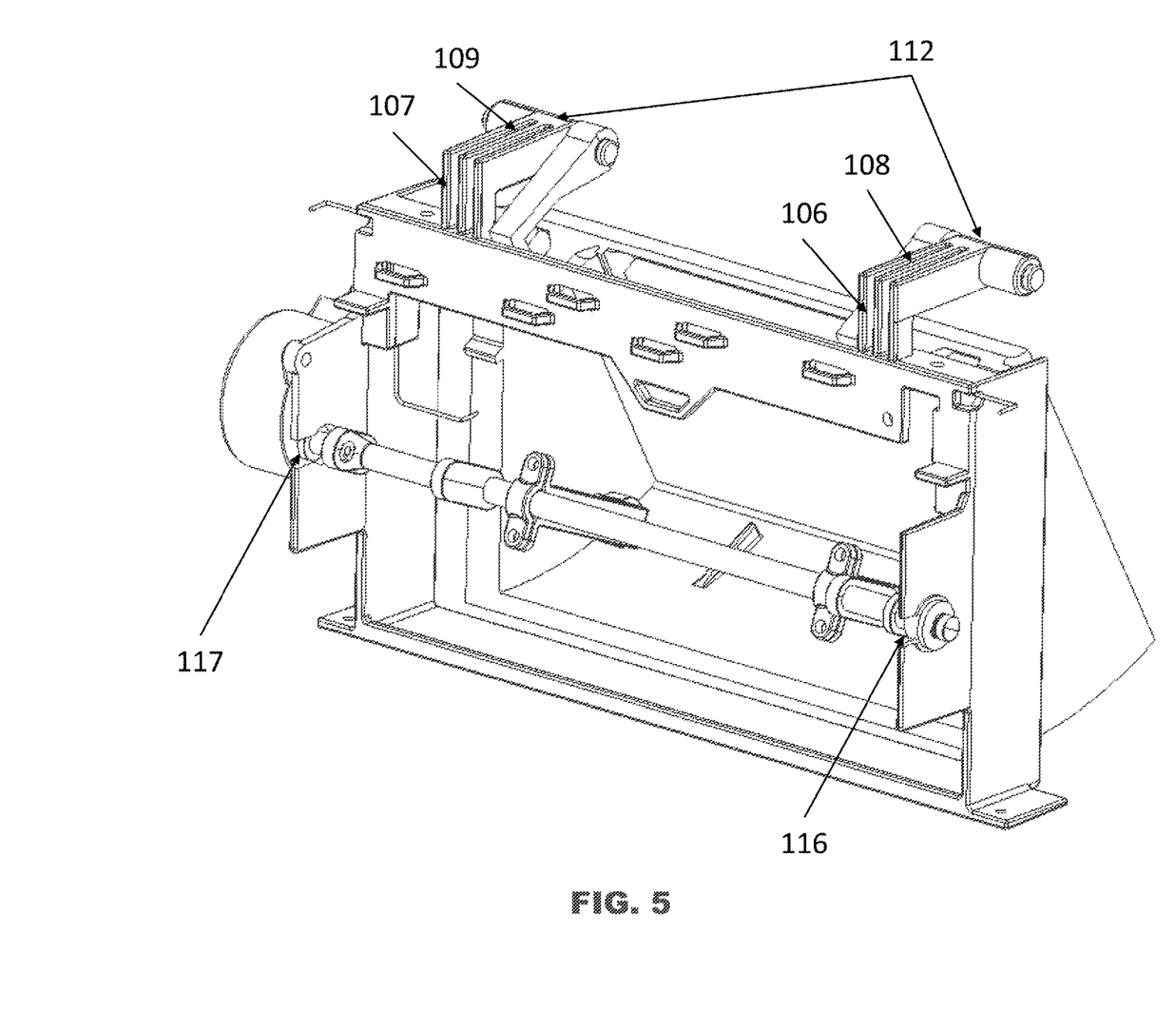
FIG. 5 is a back left perspective view of the motorized mechanism of instant invention in a working position.
Figure 6:
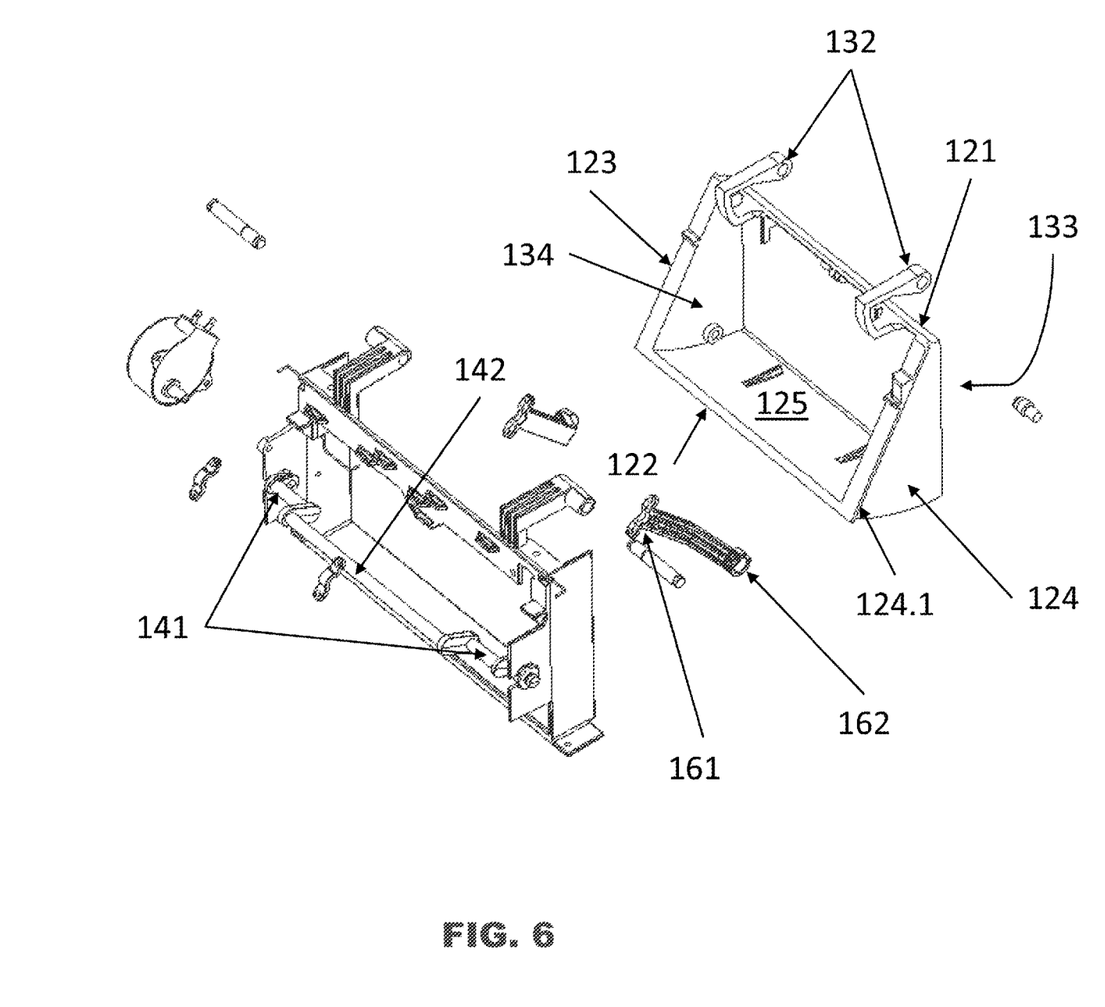
FIG. 6 is an exploded back perspective view of the motorized mechanism of instant invention.
Figure 7:
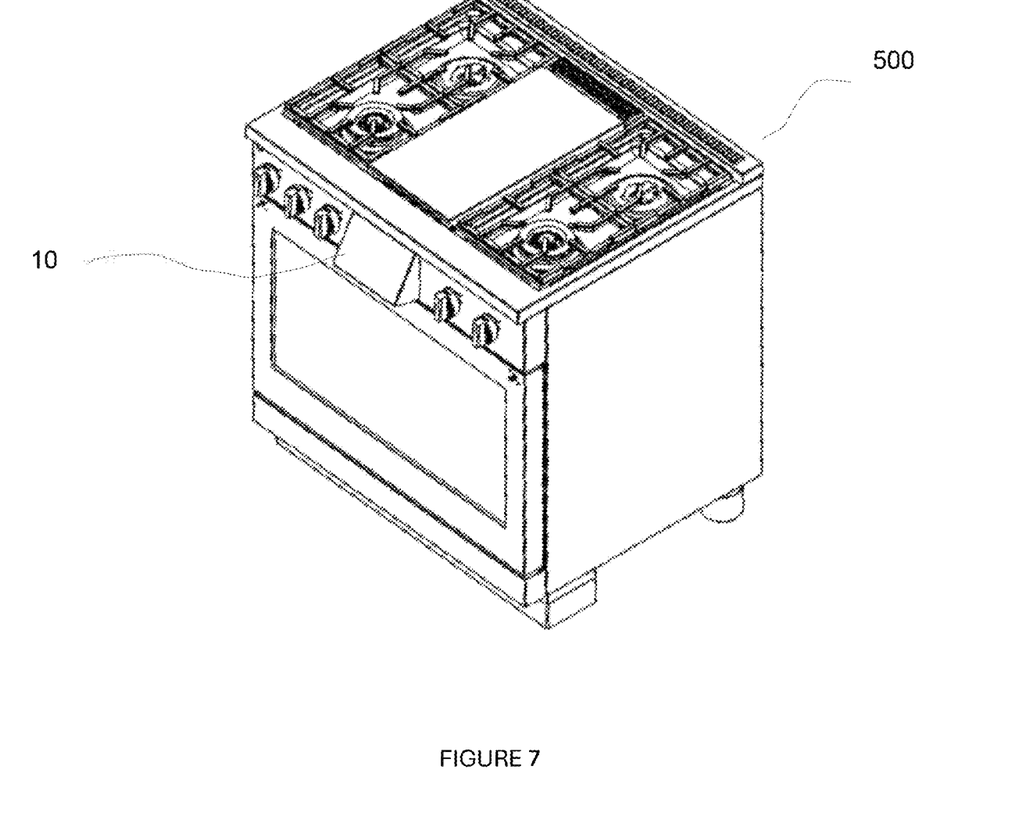
FIG. 7 is a perspective view of a household appliance with a control panel with the motorized mechanism of the instant invention.

FIGS. 1 through 6 show the motorized mechanism (10) for the control panel of instant invention, said motorized mechanism (10) comprises a fixed frame (100) and a mobile frame (120); said fixed frame (100) is preferably coupled to a kitchen appliance structure 500, such as a stove, whether gas or electric oven (see FIG. 2), a control panel is set in the inner part of said mobile frame (120).

Said fixed frame (100) preferably is found in a quadrangle shape, such that at least one upper wall (101) is present, a lower wall (102), a first side wall (103), a second side wall (104), a front face (113) and a back face (114), said second side wall (104) being diametrically opposed to the first side wall (103), alternatively, the fixed frame (100) has an octagonal configuration; said upper wall (101) is segmented into a first upper wall segment (101.1) and a second upper wall segment (101.2), said first and second upper wall segments (101.1, 101.2) are separated by a central gap (105); said first and second upper wall segments (101.1, 101.2) have a free end respectively, said free ends being attached to said gap (105); from said free ends, a post (106, 107) extends vertically upward, at the highest end of the posts (106, 107) a horizontal arm (108, 109) extends further than the frontal face (113), said horizontal arms (108, 109) present a more distant end where a first hinge type pivot (112) is found. Said first side wall (103) and second side wall (104) each one in their central part have an extension (103.1, 104.1), said extensions (103.1, 104.1) each one present a semicircular gap (116, 117).

The lower wall (102) of said fixed frame (110) extends further than said first side wall (103) and second side wall (104), forming fastening fins (102.1).

Between said first side wall (103) and second side wall (104) of the fixed frame (110) a back wall (115) is set, said back wall (115) is found under said first and second segments of the upper wall (101.1, 101.2) and above the extensions (103.1, 104.1) of said first side wall (103) and second side wall (104); said back wall (115) present a plurality of cavities (116) set in an irregular manner in order to provide harness support and arrangement.

In the inner part of the fixed frame (100) a mobile frame (120) is set, said mobile frame (120) preferably presents a quadrangle configuration, such that at least one upper wall (121) is present, a lower wall (122), a first side wall (123), a second side wall (124), a front face (133) and a back face (134), said second side wall (124) being diametrically opposed to the first side wall (123), alternatively, the mobile frame (120) has an octagonal configuration; said lower wall (122) presents a concave surface (125); from said upper wall (121) further away from the back face (134), extend first horizontal arms (126, 127) in close vicinity to said first and second side walls (123, 124), in the farthest back end of the first arms (126, 127) a post extends vertically upward (128, 129), said posts present a higher end from which second horizontal arms (135, 136) extend farther away than the front face (133), at the outermost end of said second horizontal arms (135, 136) a second hinge type pivot (132) is found. Said first side wall (123) and second side wall (124) have a semitrapezoidal configuration, such that their upper end is much narrower than their lower end, furthermore, said lower end has a curved configuration, specifically convex curved.

Said first and second side walls (123, 124) each have a lateral flange (123.1, 124.1), such that the lateral flange (123.1) of the first side wall (123) of the mobile frame (120) extends towards the first side wall (103) of the fixed frame (100) and that the lateral flange (124.1) of the second side wall (124) of the mobile frame (120) extends towards the second side wall (104) of the fixed frame (100), these lateral flanges (123.1, 124.1) close the accessible space in a working position.

The first hinge type pivot (112) of the fixed frame (110) is aligned with the second hinge type pivot (132) of the mobile frame (120) and they are connected to each other by means of bolts (137).

In the semicircular gaps (116, 117) of said extensions (103.1, 104.1) of the fixed frame (110), a crankshaft (140) is set, said crankshaft (140) presents two end sections (141) and one central section (142), whereby the central section (142) is found set between said end sections (141).

A driver motor (150) is set on one of said extensions (103.1, 104.1) and in rotary coupling with one of the end sections (141) of the crankshaft (140), in order to provide rotary movement to said crankshaft (140), said activation motor (150) is powered by an alternating current (AC) or direct current (DC).

At least one driving arm (160) coupled to said crankshaft (140) at a first end (161) of said driving arm (160) and to one of said first side wall (123) and second side wall (124) of the mobile frame (120) at a second end (162) of said driving arm (160); the crankshaft coupling (140) is undertaken in the central section (142) thereof, while the coupling to one of said first side wall (123) and second side wall (124) is undertaken on an inner surface of said first and second side walls (123, 124), specifically on its lower end. In a preferred embodiment one driving arm (160) is used, in a second preferred embodiment two driving arms (160) are used, so that each driving arm (160) is coupled to each of said first side wall (123) and second side wall (124) of the mobile frame (120).

Alterations to the herein described structure may be foreseen by those persons skilled in the art. However, it should be understood that instant specification relates to the preferred embodiments of the invention, which serves for illustrative purposes only, and should not be construed as a limitation of the invention. All obvious alterations made in the spirit of the invention, such as changes to the shape, of the material and sizes of the features that make up the invention, should be considered as being within the scope of the attached claims.

Obviously, many variations and alterations to instant invention in light of prior art disclosures exist. Thus, it should be understood, that within the scope of the described invention, the invention can be undertaken in another manner than the one which is specifically described.

The invention claimed is:

1. Motorized mechanism for control panel comprising:
 a fixed frame presenting a first pivot set above an upper end of said fixed frame and further away from a front face of said fixed frame;
 a mobile frame set on the inner part of the fixed frame, said mobile frame presents a second pivot set above an upper end of said mobile frame and further away from a front face of said mobile frame;
 said first and second pivots are attachable to each other;
 a drive motor set on a first side wall of the fixed frame, said drive motor is found in rotary coupling with a crankshaft supported between the first side wall and the second side wall, the second side wall being diametrically opposed to the first side wall;
 at least one drive arm presenting a first end coupled to said crankshaft and a second end coupled to a side wall of the mobile frame, in such a way that upon driving the drive motor, it causes the crankshaft to turn, such that after half a turn of the crankshaft, said at least one drive arm pushes the mobile frame to a working position outside the fixed frame, and such that the crankshaft upon making a complete turn, the drive arm pulls said mobile frame to a resting position aligned with the fixed frame.

2. The motorized mechanism according to claim 1, wherein the fixed frame comprises at least one upper wall, one lower wall, one front face and one back face and wherein said upper wall is found segmented into a first upper wall segment and a second upper wall segment, said first and second upper wall segments are separated by a central gap.

3. The motorized mechanism according to claim 2, wherein said first and second upper wall segments have a free end respectively, said free ends being attached to said gap.

4. The motorized mechanism according to claim 3, wherein from said free ends a post extends vertically upward, at the highest end of the posts a horizontal arm extends further than the frontal face, said horizontal arms present a more distant end where a first hinge type pivot is found.

5. The motorized mechanism according to claim 1, wherein said first side wall and second side wall, each one, in their central part, have an extension, said extensions each one present a semicircular gap.

6. The motorized mechanism according to claim 5, wherein the crankshaft is set in the semi-circular gaps of said extensions of the fixed frame.

7. The motorized mechanism according to claim 5, wherein the drive motor is set on one of said extensions and in coupling with an end section of the crankshaft in order to provide rotary movement to said crankshaft and wherein said drive motor is powered by one of either alternating current (AC) or by direct current (DC).

8. The motorized mechanism according to claim 5, wherein between said first side wall and second side wall of the fixed frame a back wall is found under said first and second segments of the upper wall and above the extensions of said first side wall and second side wall and wherein said back wall presents a plurality of cavities set in an irregular manner.

9. The motorized mechanism according to claim 1, wherein the lower wall of said fixed frame extends further than said first side wall and second side wall, forming fastening fins.

10. The motorized mechanism according to claim 1, wherein the mobile frame presents one upper wall, a lower wall, a first side wall, a second side wall, a front face and a back face, said second side wall being diametrically opposed to the first side wall.

11. The motorized mechanism according to claim 10, wherein said lower wall presents a concave surface.

12. The motorized mechanism according to claim 10, wherein from said upper wall further away from the back face, extend first horizontal arms in close vicinity to said first and second side walls, in the farthest back end of the first arms a post extends vertically upward, said posts present a higher end from which second horizontal arms extend farther away than the front face, at the outermost end of said second horizontal arms a second hinge type pivot is found.

13. The motorized mechanism according to claim 10, wherein said first side wall and second side wall have a semi trapezoidal configuration, such that their upper end is much narrower than their lower end.

14. The motorized mechanism according to claim 13, wherein said lower end presents a curved configuration.

15. The motorized mechanism according to claim 14, wherein said curved configuration is a convex curved configuration.

16. The motorized mechanism according to claim 10, wherein said first and second side walls each have a lateral flange, such that the lateral flange of the first side wall of the mobile frame extends towards the first side wall of the fixed frame and that the lateral flange of the second side wall of the mobile frame extends towards the second side wall of the fixed frame.

17. The motorized mechanism according to claim 10, wherein the first hinge type pivot of the fixed frame is aligned with the second hinge type pivot of the mobile frame and are connected to each other by means of bolts.

18. The motorized mechanism according to claim 1, wherein said crankshaft presents two end sections and one central section, whereby the central section is found set between said end sections.

19. The motorized mechanism according to claim 1, wherein the coupling of the at least one driving arm to said crankshaft is undertaken in the central section of said crankshaft, while the coupling to a first side wall is undertaken on one of the first side wall and second side wall on an inner surface of said first and second side walls, specifically on its lower end.

20. A driving method for control panel comprising:
providing a household appliance which presents a control panel;
providing a motorized mechanism for the control panel according to claim 1;
coupling the fixed frame to a front surface of the household appliance;
driving the drive motor for the first time in such a way that it makes the crankshaft turn, causing the movement of at least one drive arm, said drive arm pushes the mobile frame to the working position outside the fixed frame, such that the fixed frame presents a pivoting movement on its upper part and protrudes on its lower part from the front surface of the household appliance;
driving the drive motor for the second time in such a way that it makes a crankshaft turn, causing the movement of the said at least one drive arm, said drive arm pulls the mobile frame to the resting position aligned with the fixed frame, such that the fixed frame presents a pivoting movement on its upper part and is flush with the surface of the household appliance.

* * * * *